(12) United States Patent
Tomizawa et al.

(10) Patent No.: US 9,559,279 B1
(45) Date of Patent: Jan. 31, 2017

(54) SEMICONDUCTOR LIGHT EMITTING DEVICE

(71) Applicant: Kabushiki Kaisha Toshiba, Minato-ku (JP)

(72) Inventors: Hideyuki Tomizawa, Kanazawa (JP);
Akihiro Kojima, Nonoichi (JP);
Miyoko Shimada, Hakusan (JP);
Yosuke Akimoto, Nonoichi (JP);
Hideto Furuyama, Yokohama (JP);
Yoshiaki Sugizaki, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/059,754

(22) Filed: Mar. 3, 2016

(30) Foreign Application Priority Data

Aug. 21, 2015 (JP) ................................. 2015-164072

(51) Int. Cl.
| | |
|---|---|
| *H01L 33/38* | (2010.01) |
| *H01L 33/62* | (2010.01) |
| *H01L 33/50* | (2010.01) |
| *H01L 33/36* | (2010.01) |

(52) U.S. Cl.
CPC ............... *H01L 33/62* (2013.01); *H01L 33/36* (2013.01); *H01L 33/502* (2013.01)

(58) Field of Classification Search
CPC ......... H01L 33/36; H01L 33/387; H01L 33/62
See application file for complete search history.

(56) References Cited

U.S. PATENT DOCUMENTS

| | | |
|---|---|---|
| 2005/0052878 A1 | 3/2005 | Yamada et al. |
| 2007/0241348 A1 | 10/2007 | Inoue et al. |
| 2010/0117114 A1 | 5/2010 | Suzuki et al. |
| 2010/0148198 A1 | 6/2010 | Sugizaki et al. |
| 2011/0297997 A1* | 12/2011 | Izuka .................... H01L 33/38 257/99 |

FOREIGN PATENT DOCUMENTS

JP  2007-287912  11/2007

\* cited by examiner

*Primary Examiner* — Daniel Shook
(74) *Attorney, Agent, or Firm* — Oblon, McClelland, Maier & Neustadt, L.L.P.

(57) ABSTRACT

According to one embodiment, a semiconductor light-emitting device includes a semiconductor layer including a first semiconductor layer, a second semiconductor layer, a light emitting layer, a first surface, and a second surface; an n-side electrode including a first n-side electrode and a second n-side electrode; a first contact unit; a second contact unit; an n-side interconnect unit; a p-side electrode; and an insulating film. The insulating film includes a first insulating portion, a second insulating portion, a third insulating portion, and a fourth insulating portion.

20 Claims, 9 Drawing Sheets

SEMICONDUCTOR LIGHT EMITTING DEVICE

CROSS-REFERENCE TO RELATED APPLICATION

This application is based upon and claims the benefit of priority from Japanese Patent Application No. 2015-164072, filed on Aug. 21, 2015; the entire contents of which are incorporated herein by reference.

FIELD

Embodiments described herein relate generally to a semiconductor light emitting device.

BACKGROUND

A semiconductor light emitting device having a chip size package structure has been proposed in which a phosphor layer and multiple phosphors are provided on one surface side of a semiconductor layer including a light emitting layer; and interconnect layers, external terminals, and a resin layer are provided on the other surface (mounting surface) side.

It may be challenging to improve the light output and make the light emission uniform in the semiconductor light emitting device recited above.

DETAILED DESCRIPTION

Figure 1:
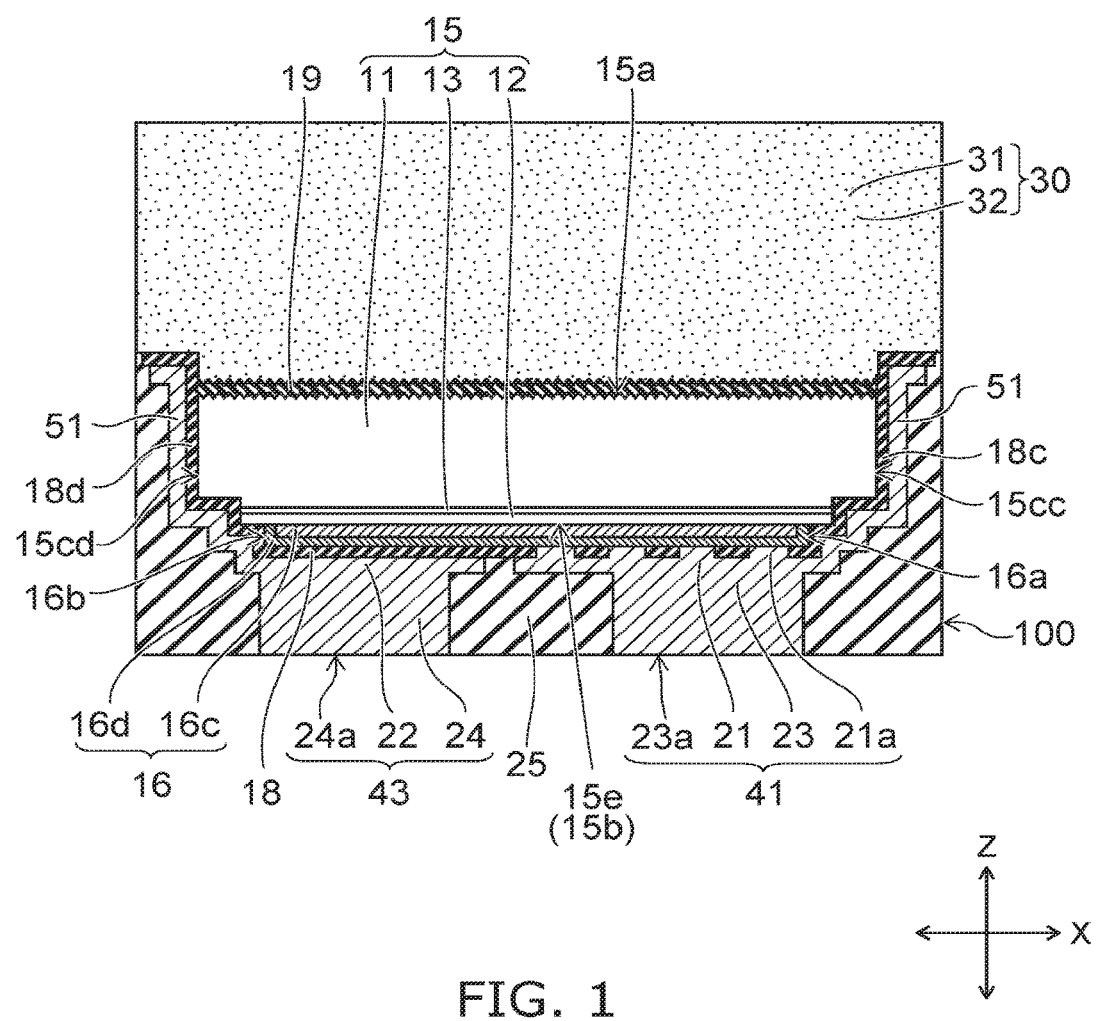
FIG. 1 is a schematic cross-sectional view of a semiconductor light emitting device of an embodiment.

According to one embodiment, a semiconductor light-emitting device includes a semiconductor layer including a first semiconductor layer, a second semiconductor layer, a light emitting layer, a first surface, and a second surface, the light emitting layer being provided between the first semiconductor layer and the second semiconductor layer, the second surface opposing the first surface; an n-side electrode including a first n-side electrode and a second n-side electrode provided to be separated from each other on the first semiconductor layer, the first n-side electrode and the second n-side electrode extending in a first direction parallel to a major surface of the first semiconductor layer; a first contact unit electrically connected to the first n-side electrode; a second contact unit separated from the first contact unit and electrically connected to the second n-side electrode; an n-side interconnect unit connected to the first contact unit and the second contact unit; a p-side electrode provided on the second semiconductor layer, the p-side electrode being provided between the first n-side electrode and the second n-side electrode when viewed in plan; and an insulating film. The insulating film is provided as one body on side surfaces of the semiconductor layer, the side surfaces being surfaces on an outer side of the semiconductor layer, the side surfaces including a first side surface extending in the first direction, a second side surface opposing the first side surface, a third side surface extending in a second direction, and a fourth side surface opposing the third side surface, the second direction intersecting the first direction. The insulating film includes a first insulating portion provided along a side surface of the first n-side electrode from the first side surface, a second insulating portion provided along a side surface of the second n-side electrode from the second side surface, a third insulating portion provided along a first end surface of the p-side electrode from the third side surface, the first end surface extending in the second direction, and a fourth insulating portion provided along a second end surface of the p-side electrode from the fourth side surface, the second end surface opposing the first end surface.

Embodiments are described below with reference to the drawings. Note that in the drawings, the same components are denoted by the same reference numerals and signs.

The configuration of a semiconductor light emitting device of the embodiment will now be described with reference to FIG. 1 to FIG. 3B.

Figure 3A:
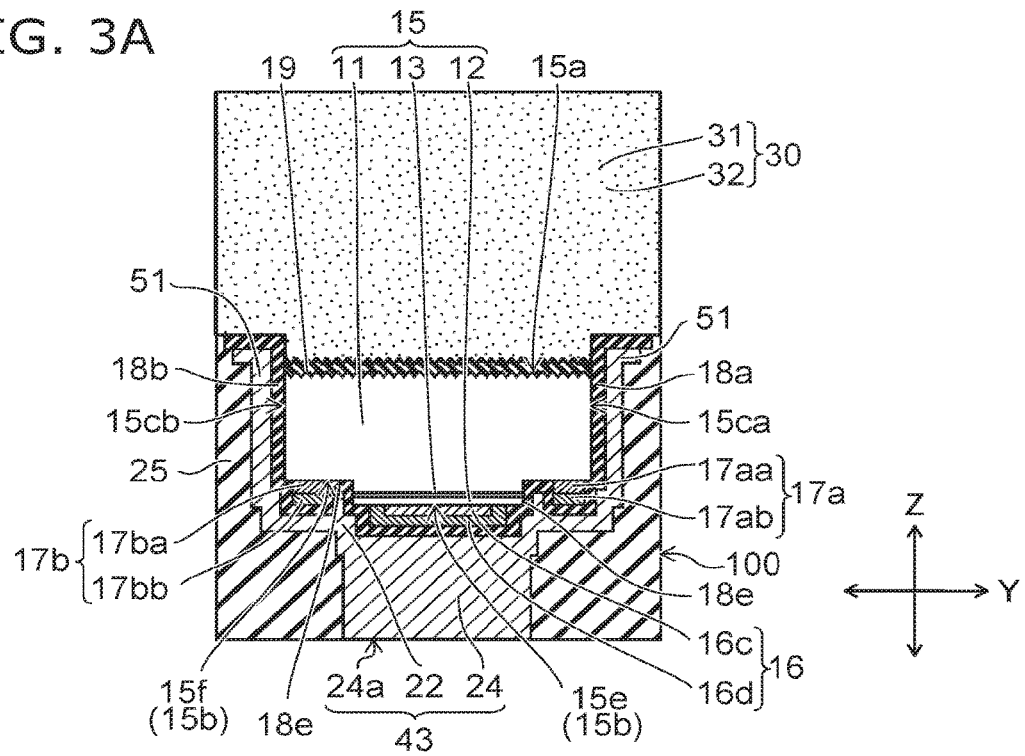
FIG. 3A and FIG. 3B are schematic cross-sectional views of a semiconductor light emitting device of the embodiment.
Figure 3B:
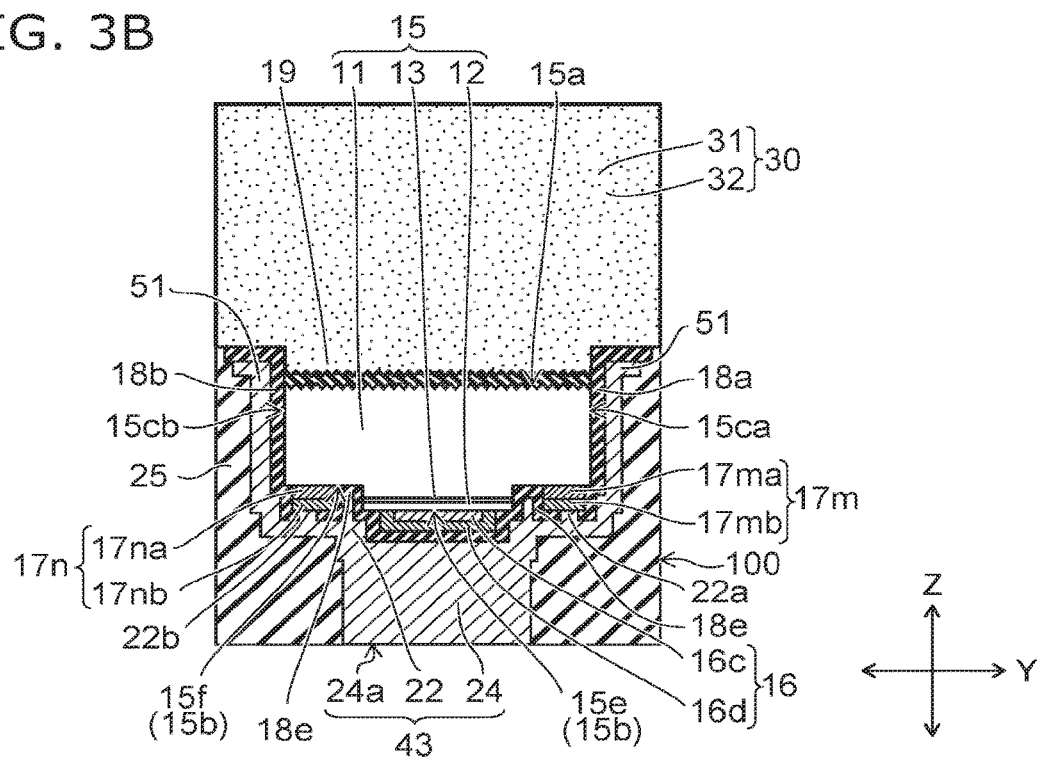

FIG. 1, FIG. 3A, and FIG. 3B are schematic cross-sectional views of the semiconductor light emitting device of the embodiment.

Figure 2A:
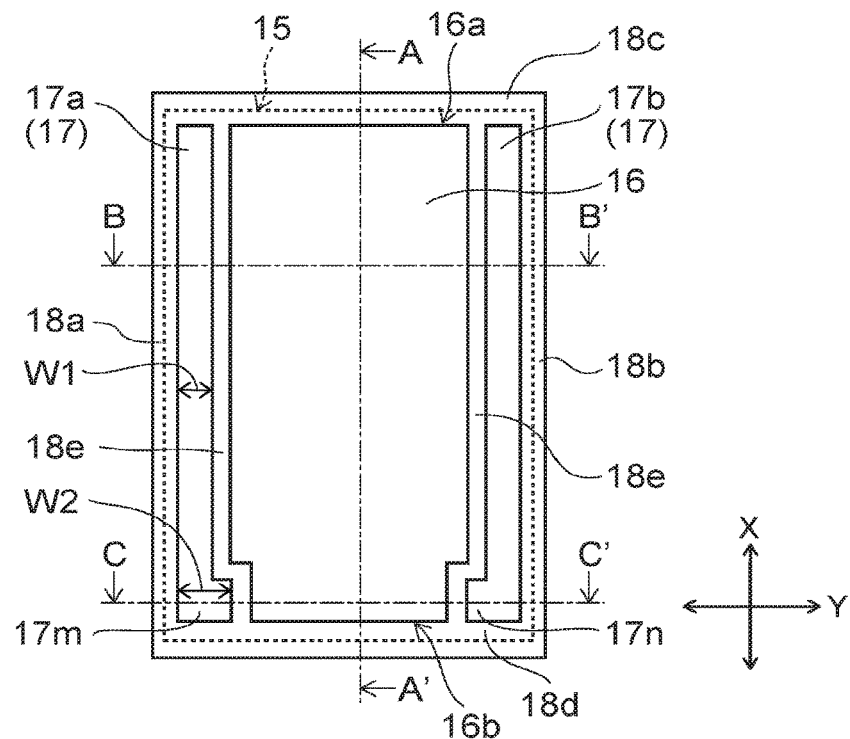
FIG. 2A is a schematic plan view showing an example of the planar layout of the semiconductor light emitting device of the embodiment.
Figure 2B:
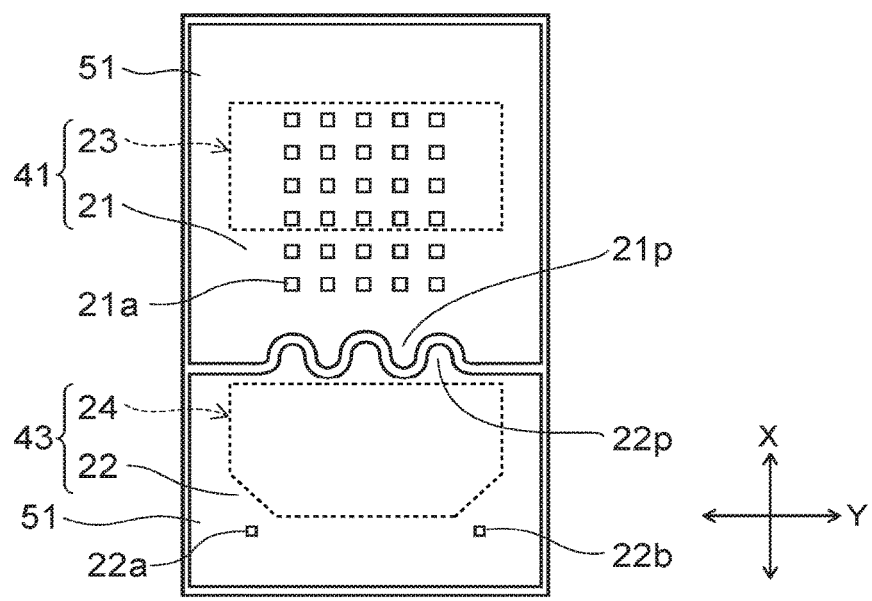
FIG. 2B is a schematic plan view showing an example of the mounting surface of the semiconductor light emitting device of the embodiment.

FIG. 2A is a schematic plan view showing an example of the planar layout of a p-side electrode 16 and an n-side electrode 17 of the semiconductor light emitting device of the embodiment; and FIG. 2B is a schematic plan view showing an example of the layout of interconnect units 41 and 43 of the semiconductor light emitting device of the embodiment.

FIG. 1, FIG. 3A, and FIG. 3B respectively correspond to an A-A' cross section, a B-B' cross section, and a C-C' cross section of FIG. 2A. FIG. 2A corresponds to a drawing in which a second surface 15b of a semiconductor layer 15 is viewed without the interconnect units 41 and 43, a portion of an insulating film 18, and a reflective film 51 of FIG. 1.

In FIG. 1 and FIG. 2A, two mutually-orthogonal directions parallel to a major surface of the semiconductor layer are taken as an X-direction (a first direction) and a Y-direction (a second direction); and a direction orthogonal to a plane (the XY plane) parallel to the X-direction and the Y-direction is taken as a Z-direction. The semiconductor light emitting device of the embodiment has long sides extending in the X-direction and short sides extending in the Y-direction when viewed in plan on the XY plane.

As shown in FIG. 1 and FIG. 2A, the semiconductor light emitting device of the embodiment includes a semiconductor layer 15 that includes a light emitting layer 13. The semiconductor layer 15 has a first surface 15a, and a second surface 15b on the side opposite to the first surface 15a.

The second surface 15b of the semiconductor layer 15 includes a portion 15e (a light emitting region) that includes the light emitting layer 13, and a portion 15f (a non-light emitting region referring to FIG. 3A) that does not include the light emitting layer 13. The portion 15e that includes the light emitting layer 13 is the portion of the semiconductor layer 15 where the light emitting layer 13 is stacked. The portion 15f that does not include the light emitting layer 13 is the portion of the semiconductor layer 15 where the light emitting layer 13 is not stacked. The portion 15e that includes the light emitting layer 13 is the region of the stacked structure where the light radiated from the light emitting layer 13 is extractable to the outside.

On the second surface 15b, the p-side electrode 16 is provided as a first electrode on the portion 15e including the light emitting layer 13; and the n-side electrode 17 is provided as a second electrode on the portion 15f not including the light emitting layer 13.

The n-side electrode 17 includes a first n-side electrode 17a and a second n-side electrode 17b. The first n-side electrode 17a and the second n-side electrode 17b extend in the X-direction and are separated from each other in the Y-direction. When viewed in plan, the p-side electrode 16 is provided between the first n-side electrode 17a and the second n-side electrode 17b. The first n-side electrode 17a and the second n-side electrode 17b are, for example, provided to be symmetric with the p-side electrode 16 interposed.

The n-side electrode 17 may have a stacked structure and includes, for example, first electrode layers 17aa and 17ab and second electrode layers 17ab and 17bb. The p-side electrode 16 may have a stacked structure and includes, for example, a third electrode layer 16c and a fourth electrode layer 16d.

A current is supplied to the light emitting layer 13 via the p-side electrode 16 and the n-side electrode 17; and the light emitting layer 13 emits light. Then, the light that is radiated from the light emitting layer 13 is emitted outside the semiconductor light emitting device from the first surface 15a.

A support body 100 is provided on the second surface 15b of the semiconductor layer 15. The light emitting element that includes the semiconductor layer 15, the p-side electrode 16, and the n-side electrode 17 is supported by the support body 100 provided on the second surface 15b.

A phosphor layer 30 that provides the desired optical characteristics to the light radiated from the light emitting layer 13 is provided on the first surface 15a of the semiconductor layer 15. The phosphor layer 30 is transmissive to the light radiated from the light emitting layer 13. For example, the phosphor layer 30 contacts the semiconductor layer 15. For example, an insulating film 19 that is adhesive may be provided between the phosphor layer 30 and the semiconductor layer 15.

The phosphor layer 30 includes multiple phosphors 31 that have particle configurations. The phosphors 31 are excited by the light radiated by the light emitting layer 13 and radiate light of a wavelength different from that of the radiated light.

The multiple phosphors 31 are formed as one body with a binder 32. The binder 32 transmits the light radiated by the light emitting layer 13 and the light radiated by the phosphors 31. Herein, "transmitting" is not limited to the transmittance being 100% and includes the case where a portion of the light is absorbed.

The semiconductor layer 15 includes a first semiconductor layer 11, a second semiconductor layer 12, and a light emitting layer 13. The light emitting layer 13 is provided between the first semiconductor layer 11 and the second semiconductor layer 12. The first semiconductor layer 11 and the second semiconductor layer 12 include, for example, gallium nitride.

The first semiconductor layer 11 includes, for example, a foundation buffer layer and an n-type GaN layer. The second semiconductor layer 12 includes, for example, a p-type GaN layer. The light emitting layer 13 includes a material that emits blue light, violet light, bluish-violet light, ultraviolet light, etc. The light emission peak wavelength of the light emitting layer 13 is, for example, 430 to 470 nm.

As shown in FIG. 3A and FIG. 3B, the second surface 15b of the semiconductor layer 15 is patterned into an uneven configuration. The protrusion of the second surface 15b is the portion 15e that includes the light emitting layer 13; and the recess of the second surface 15b is the portion 15f that does not include the light emitting layer 13. The surface of the portion 15e including the light emitting layer 13 is the surface of the second semiconductor layer 12; and the p-side electrode 16 is provided on the surface of the second semiconductor layer 12. The surface of the portion 15f not including the light emitting layer 13 is the surface of the first semiconductor layer 11; and the n-side electrode 17 is provided on the surface of the first semiconductor layer 11. As shown in FIG. 1, a portion where the n-side electrode 17 is not provided also exists in the surface of the first semiconductor layer 11.

At the second surface 15b of the semiconductor layer 15, the surface area of the portion 15e including the light emitting layer 13 is greater than the surface area of the portion 15f not including the light emitting layer 13. Also, the surface area of the p-side electrode 16 provided on the surface of the portion 15e including the light emitting layer 13 is greater than the surface area of the n-side electrode 17 provided on the surface of the portion 15f not including the light emitting layer 13. Thereby, a wide light emitting surface is obtained; and the light output can be high.

The first n-side electrode 17a and the second n-side electrode 17b of the n-side electrode 17 respectively include intermediate portions 17m and 17n that contact vias 22a and 22b (contact units) of an n-side interconnect layer 22.

The second surface 15b of the semiconductor layer 15, the p-side electrode 16, and the n-side electrode 17 are covered with the insulating film 18. The insulating film 18 is, for example, an inorganic insulating film such as a silicon oxide film, etc. The insulating film 18 is provided as one body at the periphery of the semiconductor layer 15 or on a side surface 15c (the surface on the outer side) that is continuous from the first surface 15a and covers, for example, the side surface 15c. For example, the insulating film 18 may be provided also on the side surface of the first semiconductor layer 11, the side surface of the light emitting layer 13, and the side surface of the second semiconductor layer 12 and may cover these side surfaces.

For example, the insulating film 18 covers at least the side surface of the second semiconductor layer 12 and the side surface of the light emitting layer 13. By such a formation, it is possible to protect the junction and the vicinity of the p-side electrode 16.

For example, the insulating film 18 also covers the side surface of the first semiconductor layer 11, the side surface of the light emitting layer 13, and the side surface of the second semiconductor layer 12; and the insulating film 18 may reach the insulating film 19 that is used as an adhesion layer. Thus, in the case where the insulating film 18 covers the first surface 15a and the surface on the outer side of the thin semiconductor layer 15, it is favorable for the insulating films 18 and 19 to be formed of inorganic films because the semiconductor layer 15 can be protected with higher certainty.

Another film may be provided between the insulating film 18 and the side surface 15c of the semiconductor layer 15. In such a case, for example, a configuration that better protects the light emitting layer 13 is possible.

As shown in FIG. 1, FIG. 2A, and FIG. 3A, the insulating film 18 includes insulating portions 18a to 18d. The semiconductor layer 15 includes side surfaces 15ca to 15cd. The side surfaces are described as the side surface 15c when not discriminating between the side surfaces 15ca to 15cd.

The first insulating portion 18a is provided along the side surface of the first n-side electrode 17a of the n-side electrode 17 from the first side surface 15ca of the semiconductor layer 15 extending in the X-direction. The first insulating portion 18a contacts the first side surface 15ca and the first n-side electrode 17a (including the intermediate portion 17m) and is separated from the p-side electrode 16. For example, the first insulating portion 18a may be provided, with another film interposed, between the first side surface 15ca and the first n-side electrode 17a.

A second insulating portion 18b is provided along the side surface of the second n-side electrode 17b of the n-side electrode 17 from a second side surface 15cb opposing the first side surface 15ca. The second insulating portion 18b contacts the second side surface 15cb and the second n-side electrode 17b (including the intermediate portion 17n) and is separated from the p-side electrode 16. For example, the second insulating portion 18b may be provided, with another film interposed, between the second side surface 15cb and the second n-side electrode 17b.

A third insulating portion 18c is provided along the side surface (a first end surface 16a) of the p-side electrode 16 extending in the Y-direction from a third side surface 15cc of the semiconductor layer extending in the Y-direction. The third insulating portion 18c contacts the first n-side electrode 17a, the second n-side electrode 17b, the third side surface 15cc, and the first end surface 16a of the p-side electrode 16. For example, the third insulating portion 18c may be provided, with another film interposed, between the first n-side electrode 17a, the second n-side electrode 17b, the third side surface 15cc, and the first end surface 16a of the p-side electrode 16.

The fourth insulating portion 18d is provided along the side surface (a second end surface 16b) of the p-side electrode 16 opposing the first end surface 16a from the fourth side surface 15cd opposing the third side surface 15cc. The fourth insulating portion 18d contacts the first n-side electrode 17a, the second n-side electrode 17b (including the intermediate portions 17m and 17n), the fourth side surface 15cd, and the second end surface 16b of the p-side electrode 16. For example, the fourth insulating portion 18d may be provided, with another film interposed, between the first n-side electrode 17a, the second n-side electrode 17b, the fourth side surface 15cd, and the second end surface 16b of the p-side electrode 16.

In the Y-direction, a width W2 of each of the intermediate portions 17m and 17n is wider than a width W1 of each of the first n-side electrode 17a and the second n-side electrode 17b; for example, the width W2 is not less than 3 times the width W1.

In addition to the description recited above, the insulating film 18 includes a fifth insulating portion 18e. The fifth insulating portion 18e is provided between the n-side electrode 17 and the p-side electrode 16 when viewed in plan. The fifth insulating portion 18e is provided as one body with the insulating portions 18a to 18d. The fifth insulating portion 18e may be provided, with another film interposed, between the n-side electrode 17 and the p-side electrode 16.

The insulating film 18 is further provided in the chip outer circumferential portion adjacent to the side surface 15c. The insulating film 18 that is provided in the chip outer circumferential portion extends in a direction away from the side surface 15c on the first surface 15a.

As shown in FIG. 2B, the p-side interconnect unit 41 and the n-side interconnect unit 43 are provided, with the insulating film 18 interposed, on the p-side electrode 16 and on the n-side electrode 17. The interconnect units 41 and 43 respectively include interconnect layers 21 and 22 and pillars 23 and 24. The p-side interconnect unit 41 is separated from the n-side interconnect unit 43.

Multiple vias 21a on the p-side and vias 22a and 22b on the n-side are provided in the insulating film 18. The multiple vias 21a connect the p-side interconnect unit 41 and the p-side electrode 16. The vias 22a and 22b connect the n-side interconnect unit 43 and the n-side electrode 17. The number of vias 21a is arbitrary; and one large via 21a may be provided.

The via 22a is connected to the intermediate portion 17m of the first n-side electrode 17a. The via 22b is connected to the intermediate portion 17n of the second n-side electrode 17b and is separated from the via 22a. The vias 22a and 22b and the intermediate portions 17m and 17n may be provided between the n-side interconnect layer 22 and the n-side electrode 17 and may be provided, for example, at positions other than the end portion of the n-side electrode 17. The n-side electrode 17 is electrically connected to the vias 22a and 22b via the intermediate portions 17m and 17n.

The p-side interconnect layer 21 is electrically connected to the p-side electrode 16 by the via 21a. The n-side interconnect layer 22 is electrically connected to the n-side electrode 17 by the vias 22a and 22b. When viewed in plan, the p-side interconnect layer 21 and the n-side interconnect layer 22 spread on the insulating film 18 and occupy the greater part of the region on the second side.

The p-side interconnect layer 21 includes multiple protrusions 21p protruding toward the n-side interconnect layer 22. The n-side interconnect layer 22 includes multiple protrusions 22p extending between the multiple protrusions 21p of the p-side interconnect layer 21. For example, the protrusions 21p of the p-side interconnect layer 21 are provided to be rectangular; and the protrusions 22p of the n-side interconnect layer 22 similarly are provided to be rectangular and extend between the mutually-adjacent protrusions 21p.

Thus, the stress that is applied to the semiconductor layer 15 from the p-side interconnect unit and the n-side interconnect unit can be reduced by providing protrusions and recesses in the opposing sides of the p-side interconnect layer 21 and the n-side interconnect layer 22 and by arranging the protrusions in a mutually meshing configuration.

Thereby, fluctuation of the light characteristics of the semiconductor light emitting device are suppressed; and the reliability can be increased.

As shown in FIG. 1, the side surface 15c of the semiconductor layer 15 is covered with the reflective film 51 with the insulating film 18 interposed. The reflective film 51 is separated from the side surface 15c and is not electrically connected to the semiconductor layer 15. The reflective film 51 is reflective to the light radiated by the light emitting layer 13 and the light radiated by the phosphors 31.

The reflective film 51, the p-side interconnect unit 41, and the n-side interconnect unit 43 include, for example, a copper film formed simultaneously on a common metal film by plating and are provided as one body. For example, the reflective film 51 may be separated from the p-side interconnect unit 41 and the n-side interconnect unit 43.

The reflective film 51 may be formed of a metal film in the chip outer circumferential portion adjacent to the side surface 15c of the semiconductor layer 15 without forming the plating film (the copper film) on the metal film. The reflective film 51 has a high reflectance for the light radiated by the light emitting layer 13 and the light radiated by the phosphors 31 by including at least an aluminum film.

Because the foundation metal film (the aluminum film) remains also under the p-side interconnect layer 21 and the n-side interconnect layer 22, the aluminum film is formed to spread in the region of the greater part of the second surface 15b. Thereby, the amount of the light toward the phosphor layer 30 side can be increased.

A p-type metal pillar 23 is provided on the surface of the p-side interconnect layer 21 on the side opposite to the semiconductor layer 15. The n-side metal pillar 24 is provided on the surface of the n-side interconnect layer 22 on the side opposite to the semiconductor layer 15.

A resin layer 25 is provided as a second insulating film between the p-side interconnect unit 41 and the n-side interconnect unit 43. The resin layer 25 is provided between the p-type metal pillar 23 and the n-side metal pillar 24 in contact with the p-type metal pillar 23 and the n-side metal pillar 24. In other words, the resin layer 25 is filled between the p-type metal pillar 23 and the n-side metal pillar 24.

The resin layer 25 is provided also between the p-side interconnect layer 21 and the n-side interconnect layer 22, between the p-side interconnect layer 21 and the reflective film 51, and between the n-side interconnect layer 22 and the reflective film 51.

The resin layer 25 is provided at the periphery of the p-type metal pillar 23 and the periphery of the n-side metal pillar 24 and covers the side surface of the p-type metal pillar 23 and the side surface of the n-side metal pillar 24.

The resin layer 25 is provided also in the chip outer circumferential portion adjacent to the side surface 15c of the semiconductor layer 15 and covers the reflective film 51.

The end portion (the surface) of the p-type metal pillar 23 on the side opposite to the p-side interconnect layer 21 is exposed from the resin layer 25 and functions as a p-side external terminal 23a that is connectable to an external circuit such as a mounting substrate, etc. The end portion (the surface) of the n-side metal pillar 24 on the side opposite to the n-side interconnect layer 22 is exposed from the resin layer 25 and functions as an n-side external terminal 24a that is connectable to an external circuit such as a mounting substrate, etc. For example, the p-side external terminal 23a and the n-side external terminal 24a are bonded to a land pattern of a mounting substrate via solder or an electrically conductive bonding agent.

The p-side external terminal 23a and the n-side external terminal 24a are arranged to be separated from each other in the same surface of the resin layer 25. For example, the p-side external terminal 23a is formed in a rectangular configuration; and the n-side external terminal 24a is formed in a configuration in which two corners are cut away from a rectangle having the same size as the rectangle of the p-side external terminal 23a. Thereby, the polarities of the external terminals can be discriminated. For example, the n-side external terminal 24a may have the rectangular configuration; and the p-side external terminal 23a may have the configuration in which the corners of the rectangle are cut away.

The spacing between the p-side external terminal 23a and the n-side external terminal 24a is wider than the spacing between the p-side interconnect layer 21 and the n-side interconnect layer 22 on the insulating film 18. The spacing between the p-side external terminal 23a and the n-side external terminal 24a is wider than the spreading of the solder when mounting. Thereby, shorts between the p-side external terminal 23a and the n-side external terminal 24a via the solder can be prevented.

Conversely, the spacing between the p-side interconnect layer 21 and the n-side interconnect layer 22 can be set to be narrow to the limit of the process. Therefore, the surface area of the p-side interconnect layer 21 and the contact surface area between the p-side interconnect layer 21 and the p-type metal pillar 23 can be enlarged. Thereby, the dissipation of the heat of the light emitting layer 13 can be promoted.

The surface area of the p-side interconnect layer 21 contacting the p-side electrode 16 through the multiple vias 21a is greater than the surface area of the n-side interconnect layer 22 contacting the n-side electrode 17 through the vias 22a and 22b. Thereby, the distribution of the current flowing in the light emitting layer 13 can be uniform.

The surface area of the n-side interconnect layer 22 spreading on the insulating film 18 can be greater than the surface area of the n-side electrode 17. Also, the surface area of the n-side metal pillar 24 provided on the n-side interconnect layer 22 (the surface area of the n-side external terminal 24a) can be greater than the n-side electrode 17. Thereby, it is possible to set the surface area of the n-side electrode 17 to be small while ensuring a surface area of the n-side external terminal 24a that is sufficient for high mounting reliability. In other words, it is possible to improve the light output by reducing the surface area of the portion 15f of the semiconductor layer 15 not including the light emitting layer 13 and by increasing the surface area of the portion 15e of the semiconductor layer 15 including the light emitting layer 13.

The first semiconductor layer 11 is electrically connected to the n-side metal pillar 24 via the n-side electrode 17 and the n-side interconnect layer 22. The second semiconductor layer 12 is electrically connected to the p-type metal pillar 23 via the p-side electrode 16 and the p-side interconnect layer 21.

The thickness of the p-type metal pillar 23 is thicker than the thickness of the p-side interconnect layer 21. The thickness of the n-side metal pillar 24 is thicker than the thickness of the n-side interconnect layer 22. The thicknesses of the p-type metal pillar 23, the n-side metal pillar 24, and the resin layer 25 are thicker than the semiconductor layer 15. The "thicknesses" described above are the thicknesses in the Z-direction of the interconnect layers 21 and 22 and the external terminals 23a and 24a.

The aspect ratios (the ratios of the thicknesses to the planar sizes) of the metal pillars 23 and 24 may be equal to, greater than, or less than 1. In other words, the metal pillars 23 and 24 may be thicker or thinner than their planar sizes.

The thickness of the support body 100 including the p-side interconnect layer 21, the n-side interconnect layer 22, the p-type metal pillar 23, the n-side metal pillar 24, and the resin layer 25 is thicker than the thickness of the light emitting element (the LED chip) including the semiconductor layer 15, the p-side electrode 16, and the n-side electrode 17.

For example, the semiconductor layer 15 is formed by epitaxial growth on a substrate. The substrate is removed after forming the support body 100; and the semiconductor layer 15 does not include the substrate on the first surface 15a. The semiconductor layer 15 is supported not by a substrate having a rigid plate configuration but by the support body 100 made of a compound body of the metal pillars 23 and 24 and the resin layer 25.

For example, copper, gold, nickel, silver, etc., may be used as the materials of the p-side interconnect unit 41 and the n-side interconnect unit 43. Among these, good thermal conductivity, high migration resistance, and adhesion with insulating materials can be improved when copper is used.

The resin layer 25 reinforces the p-type metal pillar 23 and the n-side metal pillar 24. It is desirable for the resin layer 25 to have a coefficient of thermal expansion near to or the same as that of the mounting substrate. Examples of such a resin layer 25 include, for example, a resin including mainly an epoxy resin, a resin including mainly a silicone resin, and a resin including mainly a fluorocarbon resin.

The resin that is the base of the resin layer 25 includes a light-shielding material (a light absorbing agent, a light reflecting agent, a light scattering agent, etc.); and the resin layer 25 is light-shielding to the light radiated from the light emitting layer 13. Thereby, light leakage from the side surface of the support body 100 and the mounting surface side can be suppressed.

In the thermal cycle when mounting the semiconductor light emitting device, the p-side external terminal 23a and the n-side external terminal 24a are bonded to the lands of the mounting substrate; and stress caused by the solder, etc., is applied to the semiconductor layer 15. The p-type metal pillar 23, the n-side metal pillar 24, and the resin layer 25 absorb and relax the stress. In particular, the stress relieving effect can be increased by using the resin layer 25 that is more flexible than the semiconductor layer 15 as a portion of the support body 100.

The reflective film 51 is provided as one body with the p-side interconnect unit 41 and the n-side interconnect unit 43. Therefore, the reflective film 51 is connected to the outside via the p-side interconnect unit 41 and the n-side interconnect unit 43. Thereby, a heat dissipation path is formed; and the heat dissipation of the semiconductor layer 15 improves. For example, as shown in FIG. 2A, a portion of the reflective film 51 is formed as one body with the p-side interconnect unit 41; the remainder of the reflective film 51 is formed as one body with the n-side interconnect unit 43; and these portions are insulated from each other.

Figure 9:
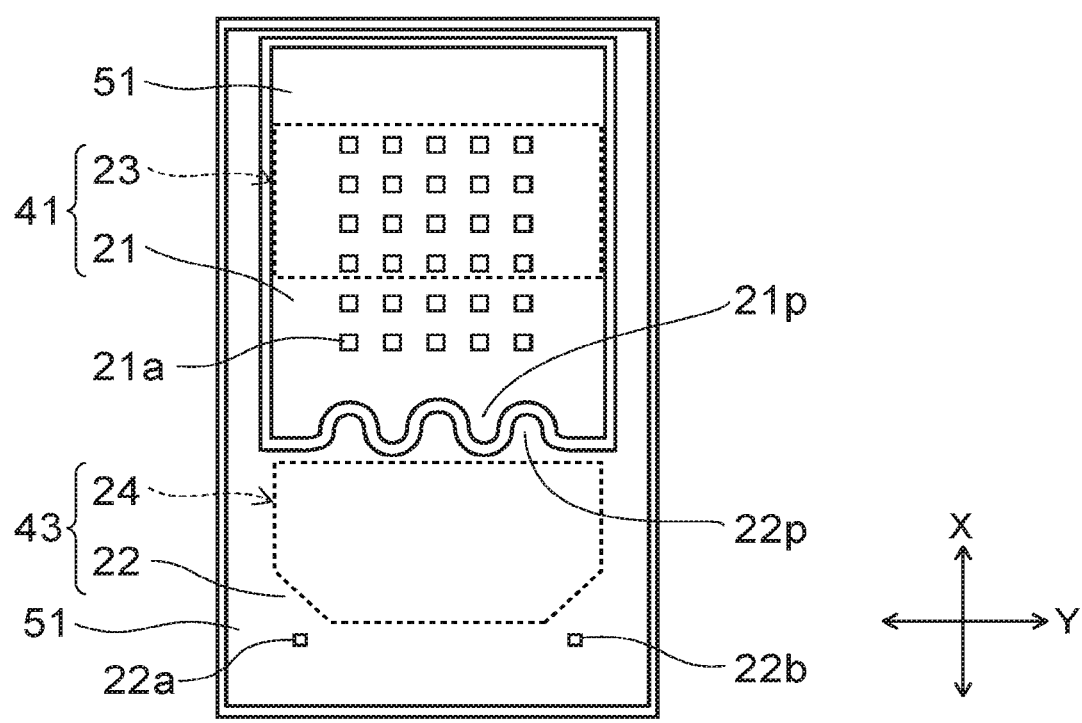
FIG. 9 is a schematic plan view showing an example of the mounting surface of the semiconductor light emitting device of the embodiment.

For example, the reflective film 51 may be formed as one body with either one of the p-side interconnect unit 41 or the n-side interconnect unit 43. In such a case, as shown in FIG. 9, the reflective film 51 may be formed to cover the entire circumference of the side surface of the semiconductor layer 15 in a ring configuration (an O-shape). Thereby, it is possible to suppress the light leakage further.

For example, the reflective film 51 may be separated from the p-side interconnect unit 41 and the n-side interconnect unit 43. In such a case, the reflective film 51 may be formed to cover the entire circumference of the side surface of the semiconductor layer 15 in a ring configuration (an O-shape). Thereby, it is possible to suppress the light leakage further.

In the Z-direction, the height of the upper surface of the reflective film 51 is, for example, higher than the first surface 15a of the semiconductor layer 15. Thereby, the light can be reflected better; and it is possible to further increase the light extraction efficiency.

For example, the substrate that is used to form the semiconductor layer 15 is removed from the semiconductor layer 15. Thereby, the semiconductor light emitting device is thinner. Also, by the removal of the substrate, a micro unevenness can be formed in the first surface 15a of the semiconductor layer 15; and the light extraction efficiency is increased.

For example, the micro unevenness is formed by performing wet etching of the first surface 15a using an alkaline solution. Thereby, the total internal reflection component at the first surface 15a is reduced; and the light extraction efficiency can be increased.

After the substrate is removed, the phosphor layer 30 is formed on the first surface 15a with the insulating film 19 interposed. The insulating film 19 functions as an adhesion layer that increases the adhesion between the semiconductor layer 15 and the phosphor layer 30 and is, for example, a silicon oxide film or a silicon nitride film.

The phosphor layer 30 has a structure in which the multiple phosphors 31 having the particle configurations are dispersed in the binder 32. The binder 32 may include, for example, a silicone resin.

The phosphor layer 30 is formed also on the chip outer circumferential portion at the periphery of the side surface of the semiconductor layer 15. Accordingly, the planar size of the phosphor layer 30 is larger than the planar size of the semiconductor layer 15. At the chip outer circumferential portion, the phosphor layer 30 is provided on the insulating film 18 (e.g., the silicon oxide film).

The phosphor layer 30 is formed on the first surface 15a of the semiconductor layer 15 and the region adjacent to the side surface of the semiconductor layer 15 and is not formed to extend around to the second surface 15b of the semiconductor layer 15, the peripheries of the metal pillars 23 and 24, or the side surface of the support body 100. The side surface of the phosphor layer 30 is aligned with the side surface of the support body 100 (the side surface of the resin layer 25).

In other words, the semiconductor light emitting device of the embodiment is an extremely small semiconductor light emitting device having a chip size package structure. Therefore, for example, the degrees of freedom of light fixture design are increased when applying to light fixtures for illumination, etc.

The phosphor layer 30 is not formed unnecessarily on the mounting surface side where the light is not extracted to the outside; and a cost reduction is realized. Even in the case where there is no substrate on the first surface 15a, the heat of the light emitting layer 13 can be dissipated to the mounting substrate side via the p-side interconnect layer 21 and the n-side interconnect layer 22 that spread on the second surface 15b; and the heat dissipation is excellent despite being small.

For a general flip chip mount, a phosphor layer is formed to cover the entire chip after the LED chip is mounted to the mounting substrate with bumps, etc., interposed. Or, a resin is under-filled between the bumps.

Conversely, according to the embodiment, the resin layer 25 that is different from the phosphor layer 30 is provided at the periphery of the p-type metal pillar 23 and the periphery of the n-side metal pillar 24 in a state prior to the mounting; and characteristics suited to stress relief can be provided to the mounting surface side. Because the resin layer 25 already is provided on the mounting surface side, the underfill after the mounting is unnecessary.

Layers designed with priority on light extraction efficiency, color conversion efficiency, light distribution characteristics, etc., are provided on the first surface 15a; and layers that have priority on stress relief when mounting and characteristics of the support body used instead of the substrate are provided on the mounting surface side. For example, the resin layer 25 has a structure in which a filler such as silica particles or the like is filled at high density into the resin used as the base; and the resin layer 25 is adjusted to have the appropriate hardness as the support body.

The light that is radiated from the light emitting layer 13 on the first surface 15a is incident on the phosphor layer 30; a portion of the light excites the phosphors 31; and, for example, white light is obtained as a mixed light of the light of the light emitting layer 13 and the light of the phosphors 31.

Here, for example, in the case where there is a substrate on the first surface 15a, there is a possibility that light may be emitted to the outside from the side surface of the substrate without the light being incident on the phosphor layer 30. In other words, light of the light emitting layer 13 that has a strong tint leaks from the side surface of the substrate which may cause color breakup and uneven color such as a phenomenon in which a ring of blue light is viewed at the outer edge side when the phosphor layer 30 is viewed from the upper surface, etc.

Conversely, according to the embodiment, there is no substrate between the first surface 15a and the phosphor layer 30. Therefore, color breakup and uneven color due to the light of the light emitting layer 13 that has a strong tint leaking from the substrate side surface can be prevented.

Further, according to the embodiment, the reflective film 51 is provided on the side surface of the semiconductor layer 15 with the insulating film 18 interposed. The light that is traveling from the light emitting layer 13 toward the side surface of the semiconductor layer 15 is reflected by the reflective film 51 and does not leak to the outside. Therefore, color breakup and uneven color due to the light leakage from the side surface side of the semiconductor light emitting device can be prevented in addition to the feature of having no substrate on the first surface 15a.

The side surface of the semiconductor layer 15 where the reflective film 51 is provided is tilted with respect to the first surface 15a (the flat portion of the first surface 15a). Also, the semiconductor layer 15 side surface is tilted with respect to the second surface 15b. Accordingly, the reflective surface that is provided on the side surface is tilted with respect to the first surface 15a and the second surface 15b. The extension line of the side surface is tilted with respect to the interface between the phosphor layer 30 and the insulating film 18 at an obtuse angle.

The insulating film 18 that is provided between the reflective film 51 and the side surface of the semiconductor layer 15 prevents the diffusion of the metal included in the reflective film 51 into the semiconductor layer 15. Thereby, for example, metal contamination of the GaN of the semiconductor layer 15 is prevented; and degradation of the semiconductor layer 15 can be prevented.

The insulating film 18 that is provided between the reflective film 51 and the phosphor layer 30 and between the resin layer 25 and the phosphor layer 30 increases the adhesion between the reflective film 51 and the phosphor layer 30 and the adhesion between the resin layer 25 and the phosphor layer 30.

The insulating film 18 is, for example, an inorganic insulating film such as a silicon oxide film, a silicon nitride film, etc. In other words, the first surface 15a and the second surface 15b of the semiconductor layer 15, the side surface 15c of the semiconductor layer 15, the side surface of the second semiconductor layer 12, and the side surface of the light emitting layer 13 are covered with an inorganic insulating film. The inorganic insulating film surrounds the semiconductor layer and shields the semiconductor layer 15 from metals, moisture, etc.

In addition to the description recited above, according to the embodiment, the n-side electrode 17 includes the first n-side electrode 17a and the second n-side electrode 17b that extend in the X-direction and are separated from each other. When viewed in plan, the p-side electrode 16 is provided between the first n-side electrode 17a and the second n-side electrode 17b. The first n-side electrode 17a contacts the first insulating portion 18a; the second n-side electrode 17b contacts the second insulating portion 18b; and the p-side electrode 16 contacts the third insulating portion 18c and the fourth insulating portion 18d. In other words, in the Y-direction, the n-side electrode 17 is provided further on the chip outer circumference side than is the p-side electrode 16. Therefore, the p-side electrode 16 is provided only in a region interposed between the first n-side electrode 17a and the second n-side electrode 17b.

Thereby, for example, compared to a structure in which the n-side electrode 17 surrounds the side surface of the p-side electrode 16, it is possible to increase the surface area of the p-side electrode 16. Also, the fluctuation of the current supplied to the p-side electrode 16 can be suppressed by providing the p-side electrode 16 between the first n-side electrode 17a and the second n-side electrode 17b.

For example, compared to a structure in which the n-side electrode 17 is interposed between the p-side electrode 16, it is possible to increase the surface area of the p-side electrode 16. Also, because the structure includes the p-side electrode 16 interposed between the n-side electrode 17, the fluctuation of the current supplied to the p-side electrode 16 can be suppressed. In other words, it is possible to provide a semiconductor light emitting device that is excellent for improving the light output and making the light emission uniform.

The results of measuring the luminance of the embodiment showed an improvement of 6% compared to the structure in which the n-side electrode 17 surrounds the side surface of the p-side electrode 16. The measurements recited above are performed by total luminous flux measurement using a photometric sphere.

For example, there are cases where a structure is used in which the phosphor layer is provided to cover the entire chip as in flip chip mounting. In such a case, the light may be radiated from the side surface in addition to the major surface of the chip. Therefore, the characteristics of the light radiated from the side surface of the chip may be improved by providing the p-side electrode on the chip outer circumference side.

In such a case, for example, the n-side electrode is provided between the p-side electrode. That is, the fluctuation of the current supplied to the p-side electrode is large because the p-side electrode is at the periphery of the n-side electrode; and there is a possibility that the light emission may be nonuniform.

Conversely, according to the embodiment, the configuration is such that it is unnecessary to consider the light that is emitted from the side surface of the semiconductor layer to the outside. Therefore, it is possible to use a configuration in which the n-side electrode 17 is provided further toward the chip outer circumference than is the p-side electrode 16 because it is possible to improve the characteristics of the light radiated from the chip even when the configuration includes the n-side electrode 17 provided further toward the chip outer circumference than is the p-side electrode 16.

Thereby, for example, the fluctuation of the current supplied to the p-side electrode 16 can be suppressed because the p-side electrode 16 is on one side of the n-side electrode 17. Further, by providing the n-side electrode 17 at the chip outer circumference, for example, because the p-side electrode 16 is on one side of the n-side electrode 17, the surface area of the insulating film provided between the electrodes can be small; and the surface area of the p-side electrode 16 can be large. In other words, it is possible to provide a semiconductor light emitting device that is excellent for improving the light output and making the light emission uniform.

According to the embodiment, a portion where the n-side electrode 17 is not provided exists on the surface of the first semiconductor layer 11. For example, as shown in FIG. 2A, the surface of the first semiconductor layer 11 where the n-side electrode 17 is not provided exists on the outer side of the end surface 16a of the p-side electrode 16. For example, this surface is formed in the same plane as the surface of the first semiconductor layer 11 of the portion where the n-side electrode 17 is provided.

Therefore, when viewed in plan, the second semiconductor layer 12 is surrounded with the first semiconductor layer 11; and a stepped portion is formed between the surface of the second semiconductor layer 12 and the surface of the first semiconductor layer 11. In other words, the second semiconductor layer 12 is not provided at the end portion of the semiconductor layer 15. Thereby, it is possible to reduce the degree of difficulty of the processing.

For example, the processes of forming the semiconductor light emitting device include a process of subdividing the semiconductor layer in a wafer state. At this time, the multiple semiconductor layers 15 are formed by making a trench having a lattice configuration in the semiconductor layer in the wafer state.

At this time, for example, there are cases where the trench is made in the portion where only the first semiconductor layer 11 is formed and in the portion where the stacked body of the first semiconductor layer 11 and the second semiconductor layer 12 is formed. In such a case, because the object of the processing is different between the portions having different configurations, it may be necessary to set the processing conditions to be suited to each portion. Therefore, it may be difficult to form the trench having the lattice configuration at one time. In the case where the semiconductor layer 15 is formed using the conditions recited above, the structure includes the second semiconductor layer 12 provided at the end portion of the semiconductor layer 15. In other words, when viewed in plan, the second semiconductor layer 12 includes a portion not surrounded with the first semiconductor layer 11.

Conversely, according to the embodiment, the second semiconductor layer 12 is not provided at the end portion of the semiconductor layer 15. In other words, when subdividing the semiconductor layer in the wafer state, the trench is made in the portion where only the first semiconductor layer 11 is formed; and the trench is not made in the portion where the stacked body of the first semiconductor layer 11 and the second semiconductor layer 12 is formed. Therefore, the trench having the lattice configuration can be formed at one time; and it is possible to reduce the degree of difficulty of the processing.

Examples of planar layouts of the semiconductor light emitting device of the embodiment will now be described with reference to FIG. 4A to FIG. 6.

FIG. 4A to FIG. 6 show an example of the planar layout of the p-side electrode 16 and the n-side electrode 17 of the semiconductor device of the embodiment.

Similarly to FIG. 2A, FIG. 4A to FIG. 6 correspond to drawings in which the second surface 15b of the semiconductor layer 15 is viewed without the interconnect units 41 and 43, a portion of the insulating film 18, and the reflective film 51. The main difference from the layout shown in FIG. 2A is the configurations of the p-side electrode 16 and the n-side electrode 17. Therefore, a description is partially omitted for similar portions.

Figure 4A:
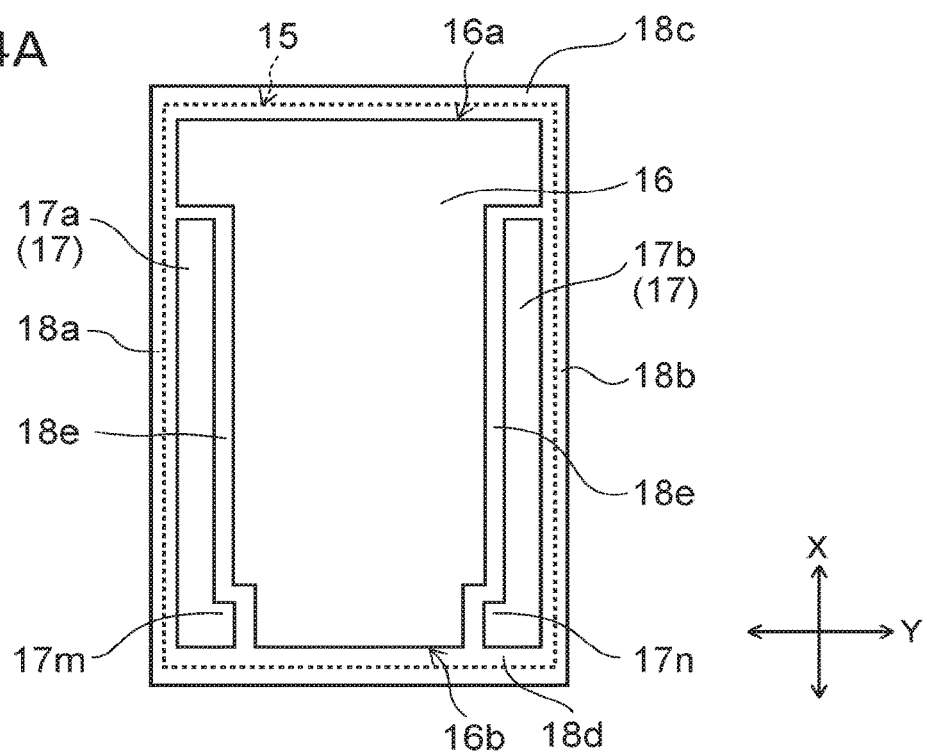
FIG. 4A and FIG. 4B are schematic plan views showing an example of the planar layout of the semiconductor light emitting device of the embodiment.

As shown in FIG. 4A, the first insulating portion 18a and the second insulating portion 18b contact the p-side electrode 16. The third insulating portion 18c is separated from the first n-side electrode 17a and the second n-side electrode 17b. The fourth insulating portion 18d contacts the first n-side electrode 17a and the second n-side electrode 17b (including the intermediate portions 17m and 17n).

In other words, the p-side electrode 16 is provided between the third insulating portion 18c and the first n-side electrode 17a and between the third insulating portion 18c and the second n-side electrode 17b. Therefore, the surface area of the p-side electrode 16 can be increased further; and it is possible to improve the light output.

Figure 4B:
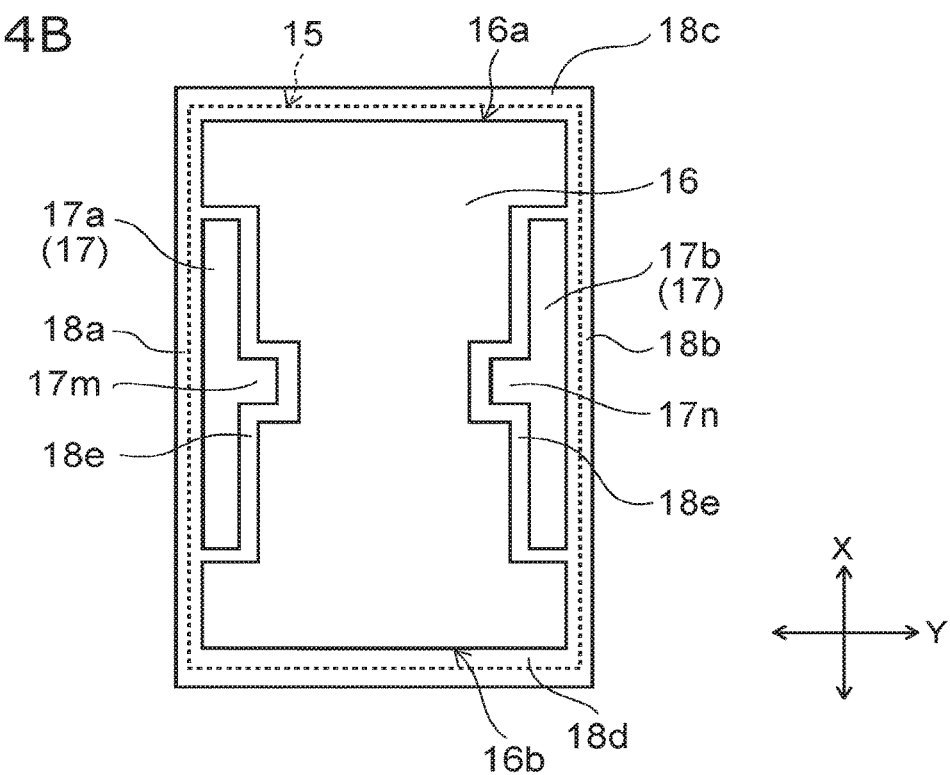

As shown in FIG. 4B, the first insulating portion 18a and the second insulating portion 18b contact the p-side electrode 16. The third insulating portion 18c is separated from the first n-side electrode 17a and the second n-side electrode 17b. The fourth insulating portion 18d is separated from the first n-side electrode 17a and the second n-side electrode 17b. For example, the intermediate portions 17m and 17n are arranged in the Y-direction and protrude toward the p-side electrode 16.

In other words, the p-side electrode 16 is provided between the n-side electrode 17 and the third insulating portion 18c and between the n-side electrode 17 and the fourth insulating portion 18d. Therefore, the surface area of the p-side electrode 16 can be increased further; and it is possible to improve the light output.

Figure 5A:
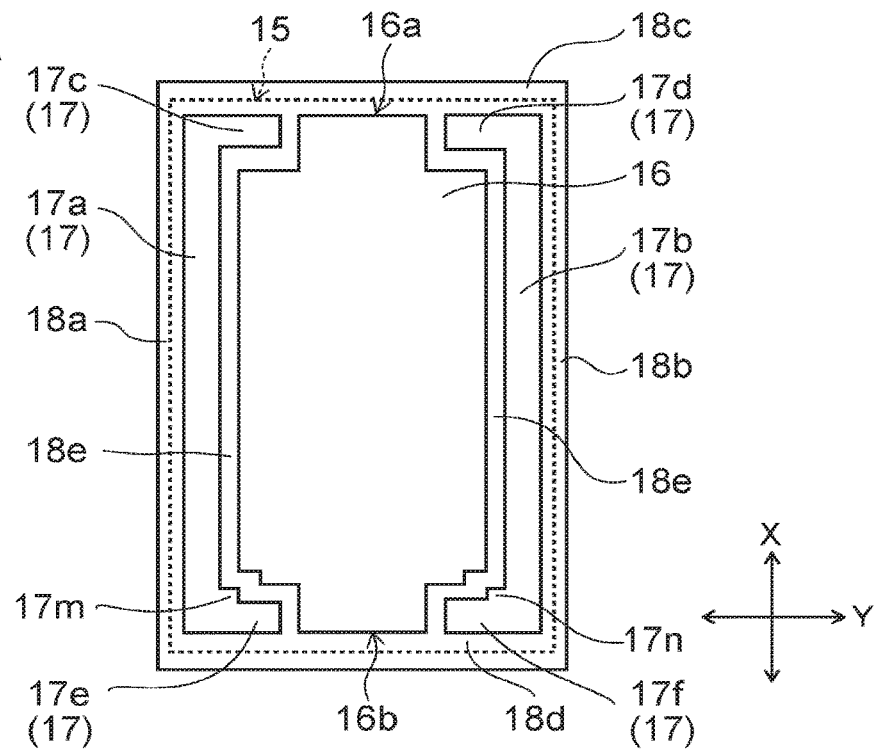
FIG. 5A and FIG. 5B are schematic plan views showing an example of the planar layout of the semiconductor light emitting device of the embodiment.

As shown in FIG. 5A, the n-side electrode 17 includes a third portion 17c, a fourth portion 17d, a fifth portion 17e, and a sixth portion 17f. The third to sixth portions 17c to 17f extend in the Y-direction and are separated from each other.

The third portion 17c and the fifth portion 17e are provided as one body with the first n-side electrode 17a. The fourth portion 17d and the sixth portion 17f are provided as one body with the second n-side electrode 17b.

The first insulating portion 18a and the second insulating portion 18b are separated from the p-side electrode 16. The third insulating portion 18c contacts the first to fourth portions 17a to 17d. The fourth insulating portion 18d contacts the first and second n-side electrodes 17a and 17b and the fifth and sixth portions 17e and 17f.

In the Y-direction, the distance between the first n-side electrode 17a and the second n-side electrode 17b is greater than the distance between the third portion 17c and the fourth portion 17d and greater than the distance between the fifth portion 17e and the sixth portion 17f.

For example, in the case where the p-side electrode is provided between a pair of n-side electrodes extending in one direction, the current that is supplied to the p-side electrode on the chip end portion side may be smaller than the current supplied to the p-side electrode at the chip center. Therefore, the fluctuation of the current supplied to the p-side electrode may be large.

Conversely, in the case of the layout described above, the third to sixth portions 17c to 17f that extend in the Y-direction are provided in the chip end portion. Thereby, the fluctuation of the current supplied to the p-side electrode 16 in the chip end portion can be suppressed. Therefore, a more uniform light emission is possible.

When viewed in plan, the surface areas of each of the third to sixth portions 17c to 17f are sufficiently small compared to the surface area of the p-side electrode 16 provided in the chip end portion. Therefore, it is possible to simultaneously improve the light output and make the light emission uniform.

Figure 5B:
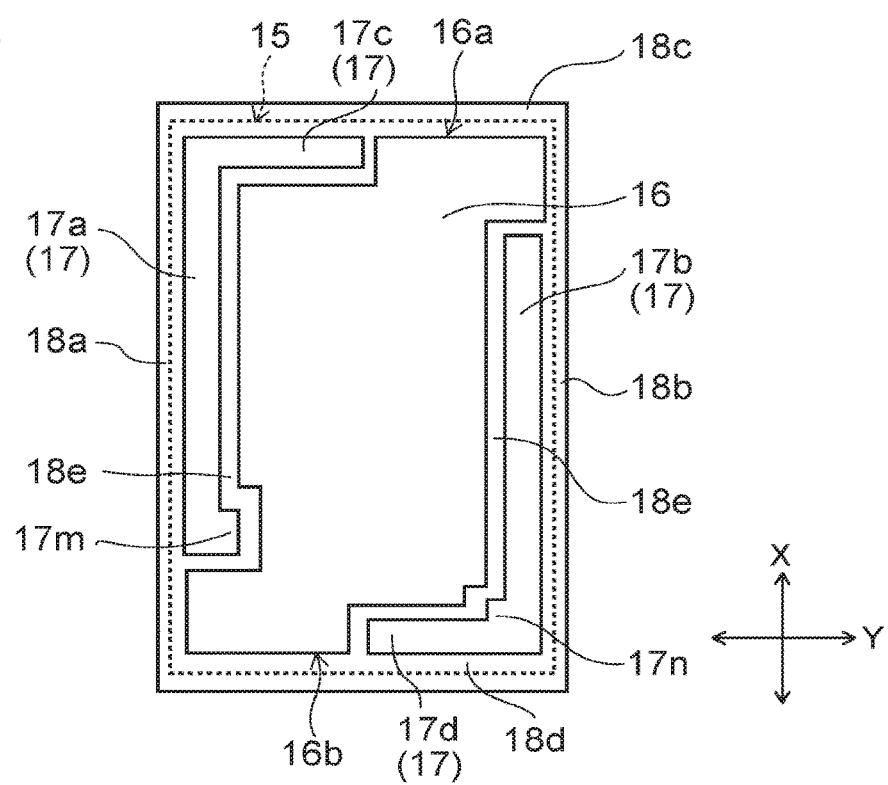

As shown in FIG. 5B, the n-side electrode 17 includes the third portion 17c and the fourth portion 17d. The third and fourth portions 17c and 17d extend in the Y-direction and are separated from each other. The third portion 17c is provided as one body with the first n-side electrode 17a. The fourth portion 17d is provided as one body with the second n-side electrode 17b.

The first insulating portion 18a and the second insulating portion 18b contact the p-side electrode 16. The third insulating portion 18c contacts the first n-side electrode 17a and the third portion 17c and is separated from the second n-side electrode 17b and the fourth portion 17d. The fourth insulating portion 18d contacts the second n-side electrode 17b and the fourth portion 17d and is separated from the first n-side electrode 17a and the third portion 17c. For example, the intermediate portion 17m is provided at the position most proximal to the fourth insulating portion 18d on the first n-side electrode 17a.

In other words, the p-side electrode 16 is provided between the first n-side electrode 17a and the fourth insulating portion 18d and between the second n-side electrode 17b and the third insulating portion 18c. Therefore, the surface area of the p-side electrode 16 can be increased further; and it is possible to improve the light output.

When viewed in plan, the surface areas of each of the third portion 17c and the fourth portion 17d are sufficiently small compared to the surface area of the p-side electrode 16 provided in the chip end portion. Therefore, it is possible to simultaneously improve the light output and make the light emission uniform.

Figure 6:
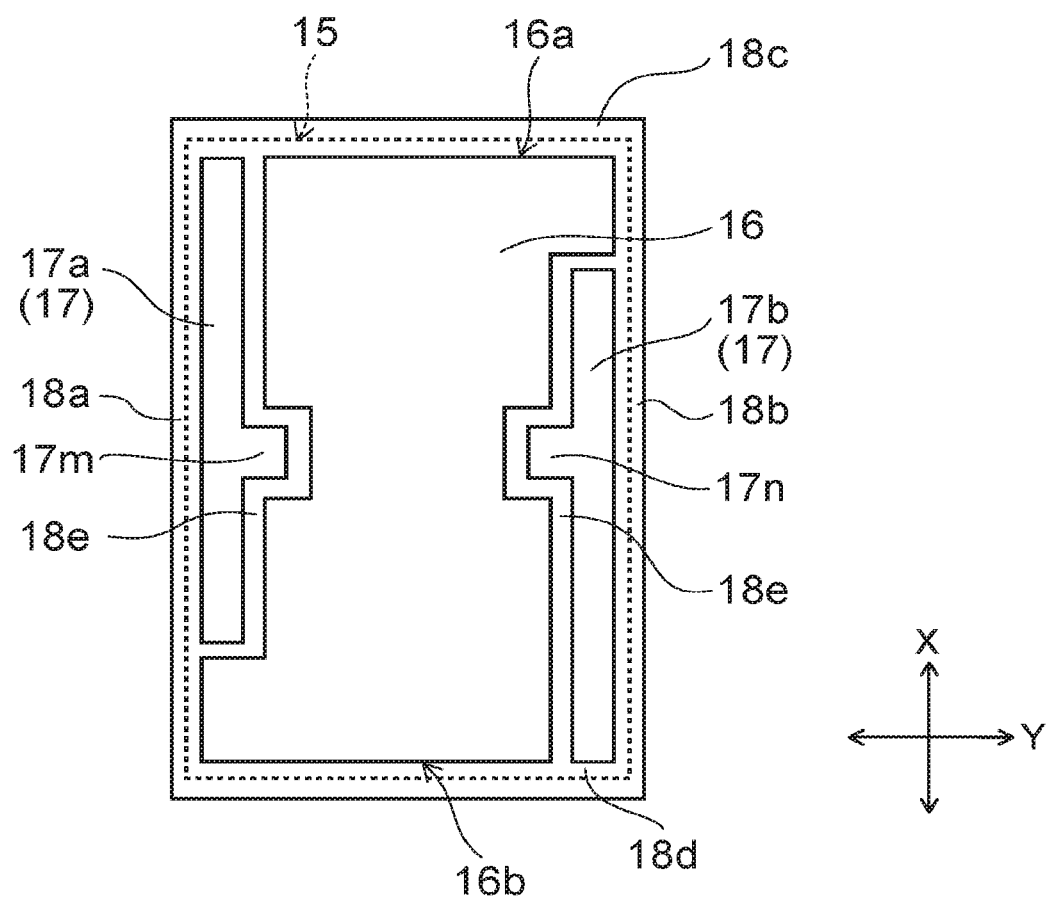
FIG. 6 is a schematic plan view showing an example of the planar layout of the semiconductor light emitting device of the embodiment.

As shown in FIG. 6, the first insulating portion 18a and the second insulating portion 18b contact the p-side electrode 16. The third insulating portion 18c contacts the first n-side electrode 17a and is separated from the second n-side electrode 17b. The fourth insulating portion 18d contacts the second n-side electrode 17b and is separated from the first n-side electrode 17a. For example, the intermediate portions 17m and 17n are arranged in the Y-direction and protrude toward the p-side electrode 16.

In other words, the p-side electrode 16 is provided between the first n-side electrode 17a and the fourth insulating portion 18d and between the second n-side electrode 17b and the third insulating portion 18c. Therefore, the surface area of the p-side electrode 16 can be increased further; and it is possible to improve the light output.

In the layouts shown in FIG. 4A to FIG. 6 as well, it is possible to provide a semiconductor light emitting device that is excellent for improving the light output and making the light emission uniform.

The configuration of a semiconductor light emitting device of another embodiment will now be described with reference to FIG. 7A to FIG. 8B.

Figure 7A:
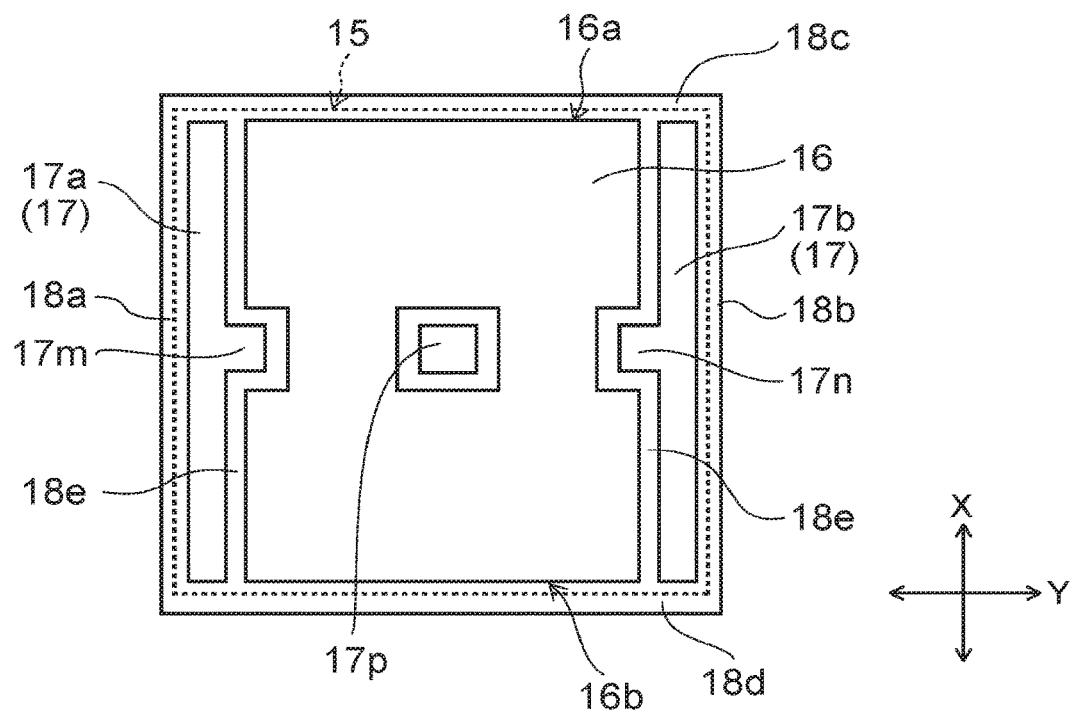
FIG. 7A is a schematic plan view showing an example of the planar layout of the semiconductor light emitting device of another embodiment.
Figure 7B:
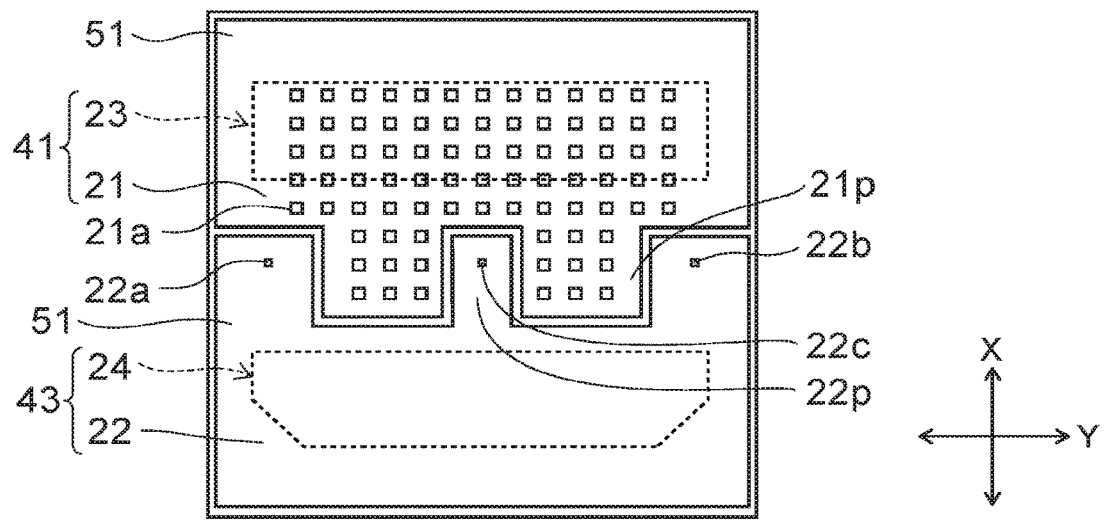
FIG. 7B is a schematic plan view showing an example of the mounting surface of the semiconductor light emitting device of the another embodiment.
Figure 8A:
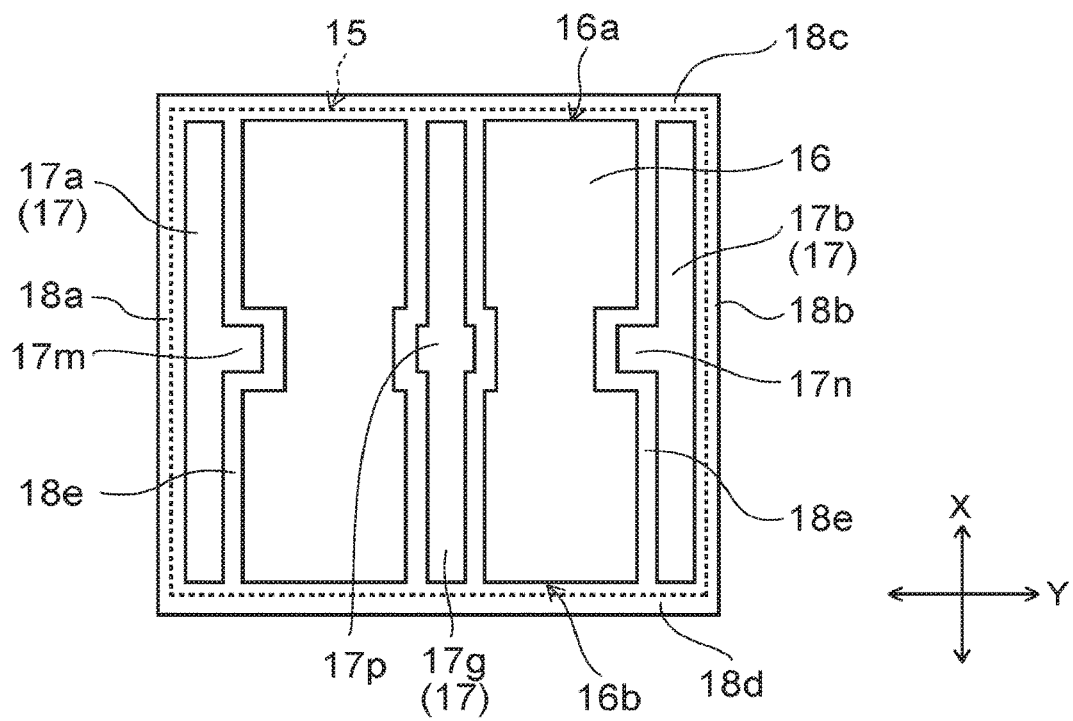
FIG. 8A is a schematic plan view showing an example of the planar layout of the semiconductor light emitting device of the another embodiment.

FIG. 7A and FIG. 8A are schematic plan views showing an example of the planar layout of the p-side electrode 16 and the n-side electrode 17 of the semiconductor light emitting device of the embodiment; and FIG. 7B and FIG. 8A are schematic plan views showing an example of the layout of the interconnect units 41 and 43 of the semiconductor light emitting device of the embodiment.

Similarly to FIG. 2A, FIG. 7A and FIG. 8A correspond to drawings in which the second surface 15b of the semiconductor layer 15 is viewed without the interconnect units 41 and 43, a portion of the insulating film 18, and the reflective film 51.

The chip configuration when viewed in plan in the embodiment is different from that of the embodiment described above. The chip configuration of the embodiment described above is a rectangle; and the chip configuration of the embodiment is a square. A description is partially omitted for configurations similar to those of the embodiment described above.

As shown in FIG. 7A, an intermediate portion 17p is provided between the intermediate portions 17m and 17n of the n-side electrode 17. The intermediate portion 17p is surrounded with the p-side electrode 16 with the insulating film 18 interposed.

As shown in FIG. 7B, the n-side interconnect layer 22 is connected to the intermediate portions 17m, 17n, and 17p of the n-side electrode 17 by the vias 22a to 22c. The vias 22a to 22c are provided inside the protrusions 22p. It is sufficient for the vias 22a to 22c to be provided between the n-side interconnect layer 22 and the n-side electrode 17; and, for example, the vias 22a to 22c may be provided at positions other than the protrusions 22p.

The p-side interconnect layer 21 is connected to the p-side electrode 16 by the multiple vias 21a. The vias 21a of the p-side interconnect layer 21 are not provided on the first n-side electrode 17a and on the second n-side electrode 17b.

As shown in FIG. 8A, for example, the n-side electrode 17 may include a seventh portion 17g. The seventh portion 17g is provided between the first n-side electrode 17a and the second n-side electrode 17b and extends in the X-direction. The intermediate portion 17p is provided on the seventh portion 17g. For example, the intermediate portion 17p is provided between the intermediate portions 17m and 17n.

When viewed in plan, the p-side electrode 16 is provided between the first n-side electrode 17a and the seventh portion 17g and between the second n-side electrode 17b and the seventh portion 17g.

The first insulating portion 18a contacts the first n-side electrode 17a and is separated from the second n-side electrode 17b, the seventh portion 17g, and the p-side electrode 16. The second insulating portion 18b contacts the second n-side electrode 17b and is separated from the first n-side electrode 17a, the seventh portion 17g, and the p-side electrode 16.

The third insulating portion 18c contacts the first n-side electrode 17a, the second n-side electrode 17b, the seventh portion 17g, and the first end surface 16a of the p-side electrode 16. The fourth insulating portion 18d contacts the first n-side electrode 17a, the second n-side electrode 17b, the seventh portion 17g, and the second end surface 16b of the p-side electrode 16. For example, the intermediate portions 17m, 17n, and 17p are arranged in the Y-direction.

Figure 8B:
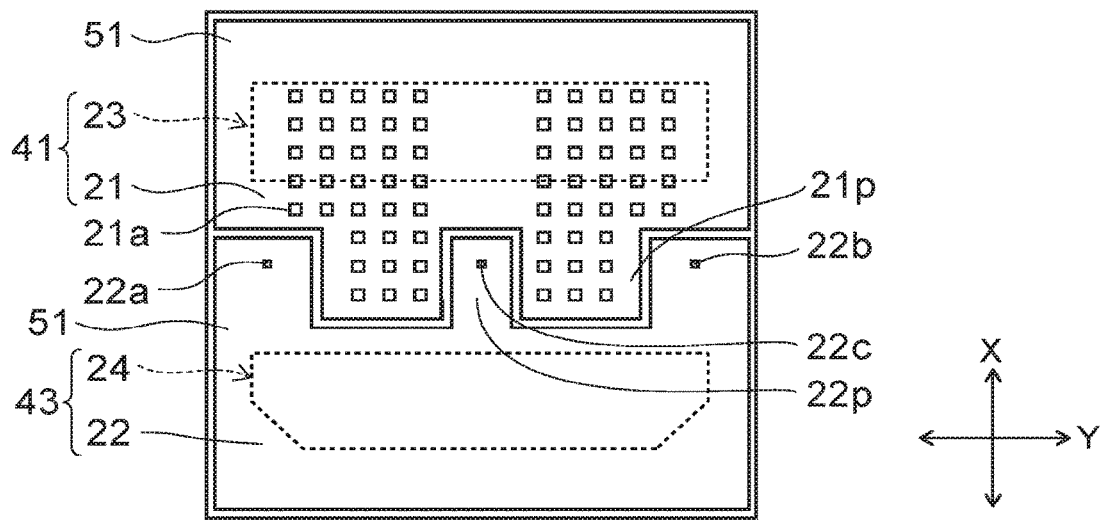
FIG. 8B is a schematic plan view showing an example of the mounting surface of the semiconductor light emitting device of the another embodiment.

As shown in FIG. 8B, the p-side interconnect layer 21 is connected to the p-side electrode 16 by the multiple vias 21a. The vias 21a of the p-side interconnect layer 21 are not provided on the first n-side electrode 17a, the second n-side electrode 17b, and the seventh portion 17g.

According to the embodiment, similarly to the embodiment described above, the n-side electrode 17 includes the first n-side electrode 17a and the second n-side electrode 17b that extend in the X-direction and are separated from each other. When viewed in plan, the p-side electrode 16 is provided between the first n-side electrode 17a and the second n-side electrode 17b. The first n-side electrode 17a contacts the first insulating portion 18a; the second n-side electrode 17b contacts the second insulating portion 18b; and the p-side electrode 16 contacts the third insulating portion 18c and the fourth insulating portion 18d. In other words, in the Y-direction, the n-side electrode 17 is provided further on the chip outer circumference side than is the p-side electrode 16.

Thereby, similarly to the embodiment described above, it is possible to provide a semiconductor light emitting device that is excellent for improving the light output and making the light emission uniform.

In addition to the description recited above, according to the embodiment, the n-side electrode 17 includes the intermediate portion 17p between the intermediate portions 17m and 17n. Also, the n-side electrode 17 includes the seventh portion 17g that extends in, for example, the X-direction.

For example, in the case of the semiconductor light emitting device in which the chip configuration is a square, compared to the p-side electrode provided in the chip outer circumferential portion, the current that is supplied to the p-side electrode provided in the chip central portion may be small. Therefore, the fluctuation of the current supplied to the p-side electrode may be large.

Conversely, according to the embodiment, the intermediate portion 17p is provided in the chip central portion. Further, the seventh portion 17g that extends in the X-direction through the chip central portion is provided. Thereby, the fluctuation of the current supplied to the p-side electrode 16 can be suppressed. Therefore, a more uniform light emission is possible; and it is possible to provide a semiconductor light emitting device that is excellent for improving the light output and making the light emission uniform.

In the embodiment as well, a layout that is similar to that of the embodiment described above can be provided. In such a case as well, it is possible to provide a semiconductor light emitting device that is excellent for improving the light output and making the light emission uniform.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
    a semiconductor layer including a first semiconductor layer, a second semiconductor layer, a light emitting layer, a first surface, and a second surface, the light emitting layer being provided between the first semiconductor layer and the second semiconductor layer, the second surface opposing the first surface;
    a n-side electrode including a first n-side electrode and a second n-side electrode provided to be separated from each other on the first semiconductor layer, the first n-side electrode and the second n-side electrode extending in a first direction parallel to a major surface of the first semiconductor layer;
    a first contact unit electrically connected to the first n-side electrode;
    a second contact unit separated from the first contact unit and electrically connected to the second n-side electrode;
    a n-side interconnect unit connected to the first contact unit and the second contact unit;
    a p-side electrode provided on the second semiconductor layer, the p-side electrode being provided between the first n-side electrode and the second n-side electrode when viewed in plan; and
    an insulating film provided as one body on side surfaces of the semiconductor layer, the side surfaces being surfaces on an outer side of the semiconductor layer, the side surfaces including a first side surface extending in the first direction, a second side surface opposing the first side surface, a third side surface extending in a second direction, and a fourth side surface opposing the third side surface, the second direction intersecting the first direction, the insulating film including
        a first insulating portion provided along a side surface of the first n-side electrode from the first side surface,
        a second insulating portion provided along a side surface of the second n-side electrode from the second side surface,
        a third insulating portion provided along a first end surface of the p-side electrode from the third side surface, the first end surface extending in the second direction, and
        a fourth insulating portion provided along a second end surface of the p-side electrode from the fourth side surface, the second end surface opposing the first end surface.

2. The device according to claim 1, wherein a length in the first direction of the semiconductor layer is longer than a length in the second direction of the semiconductor layer.

3. The device according to claim 1, wherein the first insulating portion and the second insulating portion are separated from the p-side electrode.

4. The device according to claim 1, wherein
    the first insulating portion and the second insulating portion contact the p-side electrode, and
    the third insulating portion is separated from the first n-side electrode and the second n-side electrode.

5. The device according to claim 4, wherein the fourth insulating portion contacts the first n-side electrode and the second n-side electrode.

6. The device according to claim 4, wherein the fourth insulating portion is separated from the first n-side electrode and the second n-side electrode.

7. The device according to claim 1, wherein
    the n-side electrode includes:
        a third portion extending in the second direction and contacting one of the third insulating portion or the fourth insulating portion, the third portion being provided as one body with the first n-side electrode; and a fourth portion extending in the second direction and contacting one of the third insulating portion or the fourth insulating portion, the fourth portion being provided as one body with the second n-side electrode.

8. The device according to claim 7, wherein
the n-side electrode includes:
a fifth portion extending in the second direction and contacting the fourth insulating portion, the fifth portion being provided as one body with the first n-side electrode; and
a sixth portion extending in the second direction and contacting the fourth insulating portion, the sixth portion being provided as one body with the second n-side electrode, and
the third portion and the fourth portion contact the third insulating portion, and
the p-side electrode is provided as one body between the third portion and the fourth portion in the second direction and between the fifth portion and the sixth portion in the second direction.

9. The device according to claim 8, wherein a distance between the first n-side electrode and the second n-side electrode in the second direction is greater than a distance between the third portion and the fourth portion in the second direction.

10. The device according to claim 7, wherein
the third insulating portion contacts the first n-side electrode and the third portion and is separated from the second n-side electrode and the fourth portion, and
the fourth insulating portion contacts the second n-side electrode and the fourth portion and is separated from the first n-side electrode and the third portion.

11. The device according to claim 1, wherein
the first insulating portion and the second insulating portion contact the p-side electrode,
the third insulating portion contacts the first n-side electrode and is separated from the second n-side electrode, and
the fourth insulating portion contacts the second n-side electrode and is separated from the first n-side electrode.

12. The device according to claim 1, wherein the n-side electrode includes a seventh portion provided between the first n-side electrode and the second n-side electrode, the seventh portion extending in the first direction and contacting the third insulating portion and the fourth insulating portion.

13. The device according to claim 12, wherein the semiconductor layer is a square.

14. The device according to claim 12, wherein the p-side electrode is provided between the first n-side electrode and the seventh portion and between the second n-side electrode and the seventh portion.

15. The device according to claim 1, wherein
the first n-side electrode includes a first intermediate portion contacting the first contact unit,
the second n-side electrode includes a second intermediate portion contacting the second contact unit, and
a width of the first intermediate portion and a width of the second intermediate portion in the second direction are wider than a width of the first n-side electrode and a width of the second n-side electrode in the second direction.

16. The device according to claim 15, wherein
the n-side electrode includes a third n-side electrode provided between the first n-side electrode and the second n-side electrode, and
the third n-side electrode includes a third intermediate portion provided between the first intermediate portion and the second intermediate portion and electrically connected to the n-side interconnect unit.

17. The device according to claim 16, wherein the third intermediate portion is surrounded with the p-side electrode.

18. The device according to claim 1, wherein the insulating film includes a fifth insulating portion provided between the n-side electrode and the p-side electrode.

19. The device according to claim 1, wherein the p-side electrode is provided only in a region interposed between the first n-side electrode and the second n-side electrode in the second direction.

20. The device according to claim 1, further comprising a phosphor layer provided on the first surface of the semiconductor layer.

* * * * *